(12) United States Patent
Jiang et al.

(10) Patent No.: US 7,754,182 B2
(45) Date of Patent: Jul. 13, 2010

(54) CARBON NANOTUBE ARRAY AND METHOD FOR FORMING SAME

(75) Inventors: KaiLi Jiang, Beijing (CN); ShouShan Fan, Beijing (CN); QunQing Li, Beijing (CN)

(73) Assignees: Beijing FUNATE Innovation Technology Co., Ltd., Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 1046 days.

(21) Appl. No.: 10/334,547

(22) Filed: Dec. 31, 2002

(65) Prior Publication Data

US 2004/0053053 A1 Mar. 18, 2004

(30) Foreign Application Priority Data

Sep. 17, 2002 (CN) .................................. 02 1 34776

(51) Int. Cl.
*D01F 9/12* (2006.01)
(52) U.S. Cl. ..................................... 423/447.3; 977/843
(58) Field of Classification Search .............. 427/249.1; 423/447.3; 438/962; 257/19; 977/843
See application file for complete search history.

(56) References Cited

U.S. PATENT DOCUMENTS 6,232,706 B1 * 5/2001 Dai et al. ..................... 313/309
6,361,861 B2 * 3/2002 Gao et al. .................... 428/367
6,445,006 B1 * 9/2002 Brandes et al. ................ 257/76
6,582,673 B1 * 6/2003 Chow et al. .............. 423/445 R
6,759,025 B2 * 7/2004 Hong et al. ............... 423/447.3
6,858,197 B1 * 2/2005 Delzeit ..................... 423/447.3

OTHER PUBLICATIONS

Li et al., 'Large-Scale Synthesis of Aligned Carbon Nanotubes' in Science vol. 274 pp. 1701-1703 Dec. 6, 1996.*
Willems et al. 'Heterogeneous Catalytic Production and Mechanical Resistance of Nanotubes Prepared on Magnesium Oxide Supported Co-Based Catalysts' in Applied Catalysis A: General pp. 229-233 2002 (no month).*

* cited by examiner

*Primary Examiner*—Stuart Hendrickson
(74) *Attorney, Agent, or Firm*—Wei Te Chung

(57) ABSTRACT

A method for forming a carbon nanotube array includes the following steps: providing a smooth substrate (11); depositing a metal catalyst layer (21) on a surface of the substrate; heating the treated substrate to a predetermined temperature in flowing protective gas; and introducing a mixture of carbon source gas and protective gas for 5-30 minutes, thus forming a carbon nanotube array (61) extending from the substrate. When the mixture of carbon source gas and protective gas is introduced, a temperature differential greater than 50° C. between the catalyst and its surrounding environment is created by adjusting a flow rate of the carbon source gas. Further, a partial pressure of the carbon source gas is maintained lower than 20%, by adjusting a ratio of the flow rates of the carbon source gas and the protective gas. The carbon nanotubes formed in the carbon nanotube array are well bundled.

19 Claims, 4 Drawing Sheets

CARBON NANOTUBE ARRAY AND METHOD FOR FORMING SAME

BACKGROUND OF THE INVENTION

1. Field of the Invention

The present invention relates to a carbon nanotube array and a method for forming the same, and more particularly to a carbon nanotube array in which carbon nanotubes are well aligned and a method for forming the same.

2. Description of Prior Art

Carbon nanotubes are very small tube-shaped structures having the composition of a graphite sheet rolled into a tube. Carbon nanotubes produced by arc discharge between graphite rods were first discovered and reported in an article by Sumio Iijima entitled "Helical Microtubules of Graphitic Carbon" (Nature, Vol. 354, Nov. 7, 1991, pp. 56-58).

Carbon nanotubes are electrically conductive along their length, are chemically stable, and can have very small diameters (much less than 100 nanometers) and large aspect ratios (length/diameter). Due to these and other properties, it has been suggested that carbon nanotubes can play an important role in fields such as microscopic electronics, materials science, biology and chemistry.

Existing carbon nanotube synthesis techniques include arc discharge, laser vaporization, and chemical vapor deposition (CVD). The arc discharge and laser vaporization methods are not able to satisfactorily control the diameter or length of the carbon nanotubes formed, and the yield of these methods is relatively low. Moreover, excess amorphous carbon lumps are also produced along with the carbon nanotubes, thus necessitating complicated purification processes. In summary, industrial production of carbon nanotubes using these methods is problematic. The chemical vapor deposition method is known in the art as being conducive to growing carbon nanotube arrays with well aligned carbon nanotubes.

A method for preparing a carbon nanotube array with well aligned carbon nanotubes is disclosed in an article by Fan, S. S. et al. entitled "Self-oriented regular arrays of carbon nanotubes and their field emission properties" (Science, Vol. 283, 1999, pp. 512-514). The method comprises the following steps: providing a porous silicon substrate with pore diameters of approximately 3 nanometers (nm); patterning the substrate with an iron (Fe) film by electron beam evaporation through shadow masks; annealing the substrate in air at 300° C. overnight; placing the substrate in a quartz boat and inserting the quartz boat into the center of a quartz tube reactor in a tube furnace; heating the furnace to 700° C. in flowing argon (Ar), and introducing flowing ethylene at 1000 standard cubic centimeters per minute (sccm) for 15 to 60 min.; and cooling the furnace to room temperature. A carbon nanotube array with well aligned carbon nanotubes can be observed as having been formed on top of the patterned iron squares on the substrate, by using a scanning electron microscope (SEM).

During the growth of a carbon nanotube, amorphous carbons are simultaneously deposited on the outer surface thereof. This considerably decreases van der Waals attraction between adjacent carbon nanotubes. By using the above-described method of Fan et al., van der Waals attraction between carbon nanotubes in the carbon nanotube array is relatively weak. FIG. 8 shows a transmission electron microscope (TEM) image of a carbon nanotube array formed by using the above-described method of Fan et al. and then by ultrasonicating the carbon nanotubes in 1,2-dichloroethane for 10 minutes. Carbon nanotubes in the carbon nanotube array are seen to be randomly distributed in the dichlorethane.

SUMMARY OF THE INVENTION

In view of the above-described drawbacks, an object of the present invention is to provide a method for producing a carbon nanotube array in which the carbon nanotubes each have a clean, smooth surface.

Another object of the present invention is to provide a carbon nanotube array in which carbon nanotubes are bundled by van der Waals interaction even after ultrasonication in dichloroethane.

In order to achieve the objects set out above, a method in accordance with a preferred embodiment of the present invention for forming a carbon nanotube array comprises the following steps: providing a smooth substrate; depositing a metal catalyst layer on a surface of the substrate; heating the treated substrate to a predetermined temperature in flowing protective gas; introducing a mixture of carbon source gas and protective gas for 5-30 minutes; and thus forming a carbon nanotube array extending from the substrate. When the mixture of carbon source gas and protective gas is introduced, a temperature differential greater than 50° C. between the catalyst and its surrounding environment is created and maintained by adjusting a flow rate of the carbon source gas. Further, a partial pressure of the carbon source gas is maintained lower than 20%, by adjusting a ratio of the flow rates of the carbon source gas and the protective gas. The carbon nanotubes formed in the carbon nanotube array are well bundled.

Other objects, advantages and novel features of the present invention will become more apparent from the following detailed description when taken in conjunction with the accompanying drawings, in which:

DETAILED DESCRIPTION OF PREFERRED EMBODIMENTS OF THE INVENTION

Figure 1:
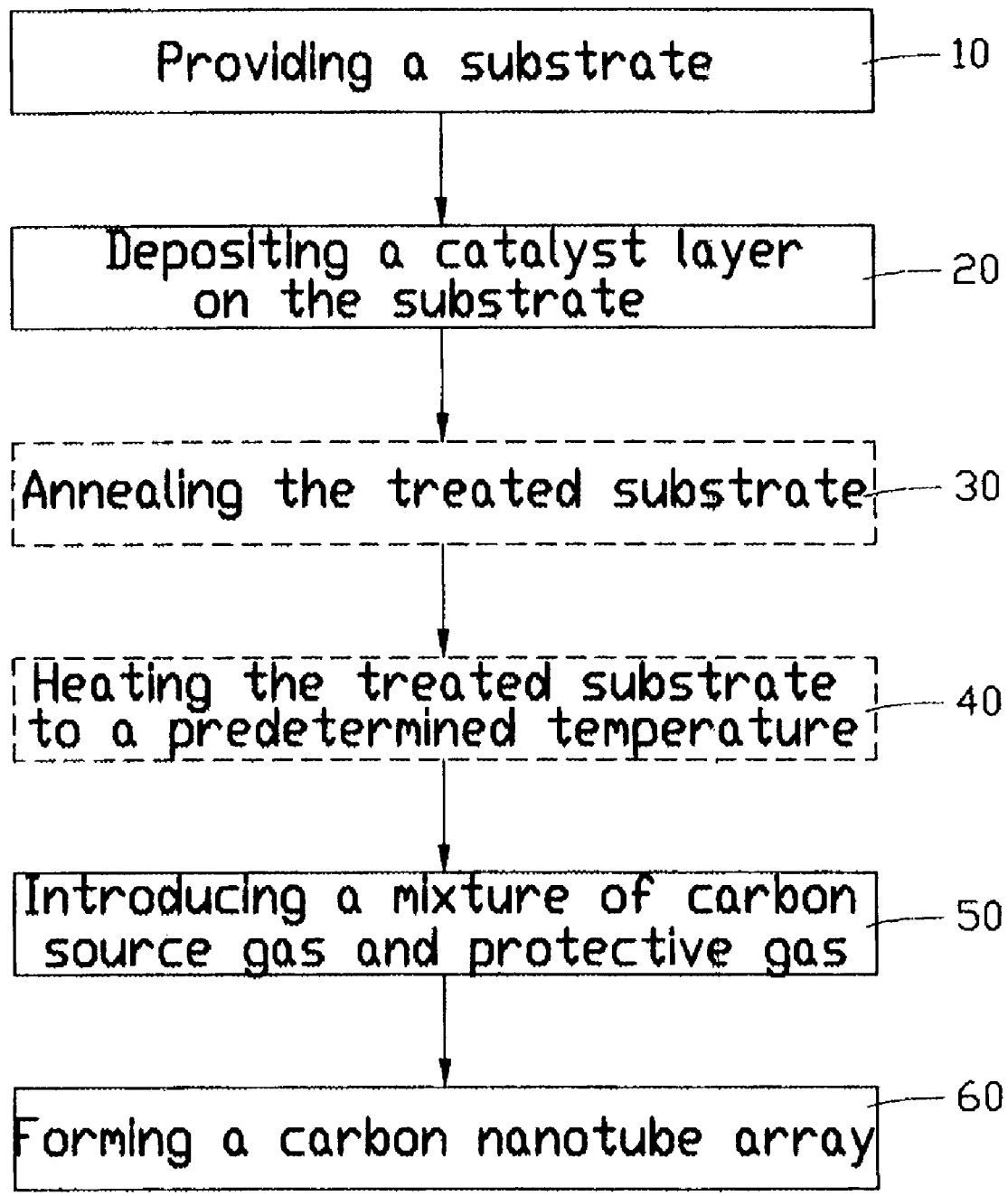
FIG. 1 is a flow chart showing a preferred method for forming a carbon nanotube array according to the present invention.

A preferred method of forming a carbon nanotube array according to the present invention will be described with reference to the flowchart of FIG. 1. In the flowchart, essential steps for forming the carbon nanotube array are shown in solid-line boxes, while optional steps are shown in dashed-line boxes.

Figure 2:
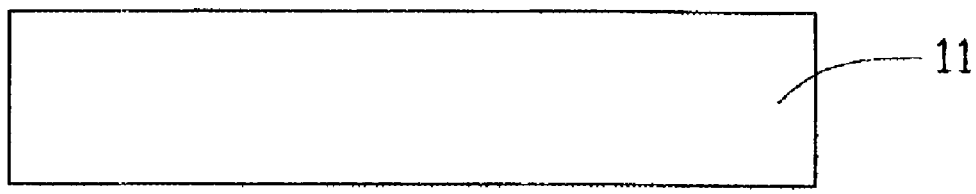
FIG. 2 is a schematic view of a substrate used in the preferred method of the present invention.
Figure 3:
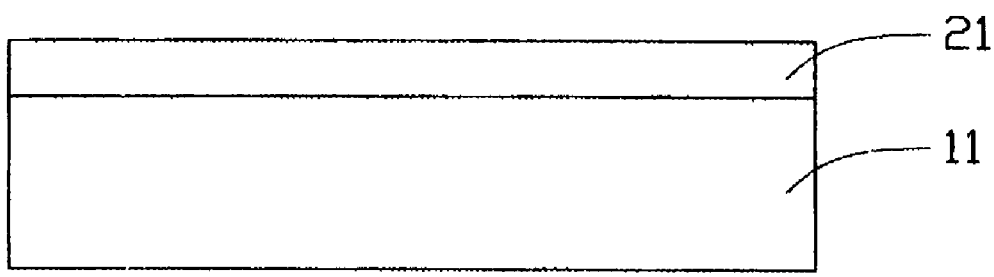
FIG. 3 is a schematic view of the substrate of FIG. 2 with a metal catalyst layer thereon.
Figure 4:
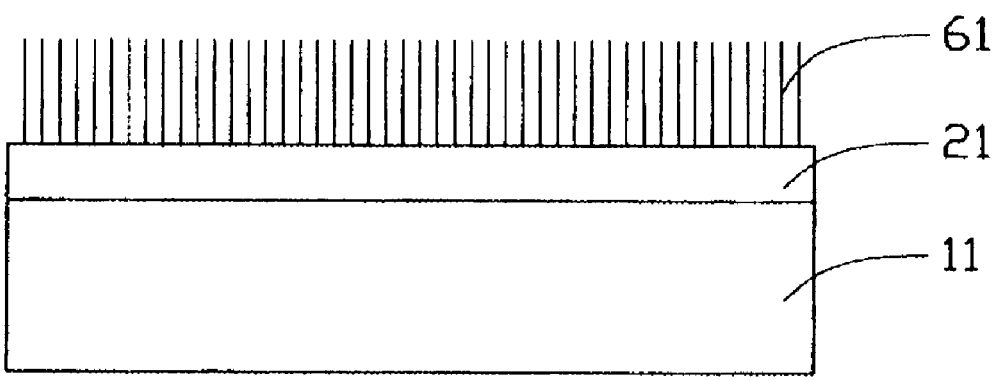
FIG. 4 is a schematic view of a carbon nanotube array formed on the metal catalyst layer on the substrate of FIG. 3.

Referring also to FIGS. 2, 3 and 4, a smooth substrate 11 is first provided (step 10). The substrate 11 can be a P-type silicon wafer, an N-type silicon wafer, an intrinsic silicon wafer, or a silicon wafer with a film of silicon oxide thereon. In the preferred method, a P-type silicon (100) wafer with an 800 nm thick thermal-oxidized layer thereon is used as the substrate 11. The substrate 11 has a diameter of 2 inches and a thickness of 350 micrometers. The substrate 11 is polished to obtain a smooth surface thereon. A metal catalyst layer 21 is deposited on said surface of the substrate 11 by electron beam evaporation, thermal evaporation or sputtering. The catalyst layer 21 has a thickness in the range from several nanometers to several hundred nanometers (step 20). The catalyst layer 21 can be iron, cobalt, nickel, or any suitable combination alloy thereof. In the preferred method, iron is used as the catalyst layer 21, and is deposited on the surface of the substrate 11 to a thickness of 5 nanometers.

The substrate 11 with the catalyst layer 21 is annealed in air at 300-400° C. for 10 hours (step 30), thereby forming an oxidized catalyst layer (not shown). The substrate 11 is then reduced to form catalyst particles (not shown) having nano-sized diameters by introducing reducing agents such as ammonia gas. After that, the substrate 11 with the catalyst layer 21 is diced into rectangular pieces.

One piece of the substrate 11 with the catalyst layer 21 is put into a quartz boat, which is then inserted into the center of a 1-inch quartz tube furnace. The tube furnace is then heated up to a predetermined temperature in flowing protective gas (step 40). The protective gas can be a noble gas or nitrogen. In the preferred method, argon is used as the protective gas. The predetermined temperature varies according to the catalyst used. In the preferred method, iron is used as the catalyst, and the predetermined temperature is 500-700° C., preferably 650° C.

A mixture of carbon source gas and protective gas is then introduced into the tube (step 50). The carbon source gas can be acetylene, ethylene, or another suitable chemical compound which contains carbon. The protective gas can be a noble gas or nitrogen. In the preferred method, acetylene is used as the carbon source gas, and argon is used as the protective gas. A flow rate of the mixture of carbon source gas and protective gas is adjusted to create a temperature differential greater than 50° C. between the catalyst and its surrounding environment. In addition, a ratio of the flow rates of the carbon source gas and the protective gas is adjusted to create a partial pressure of the carbon source gas lower than 20%. In the preferred method, the flow rates of acetylene and argon are 30 sccm and 300 sccm respectively. The mixture of carbon source gas and protective gas is introduced under these conditions for 5-30 minutes (step 60), thus forming the carbon nanotube array 61 extending from the substrate 11. The tube furnace is then cooled down to room temperature.

Figure 5:
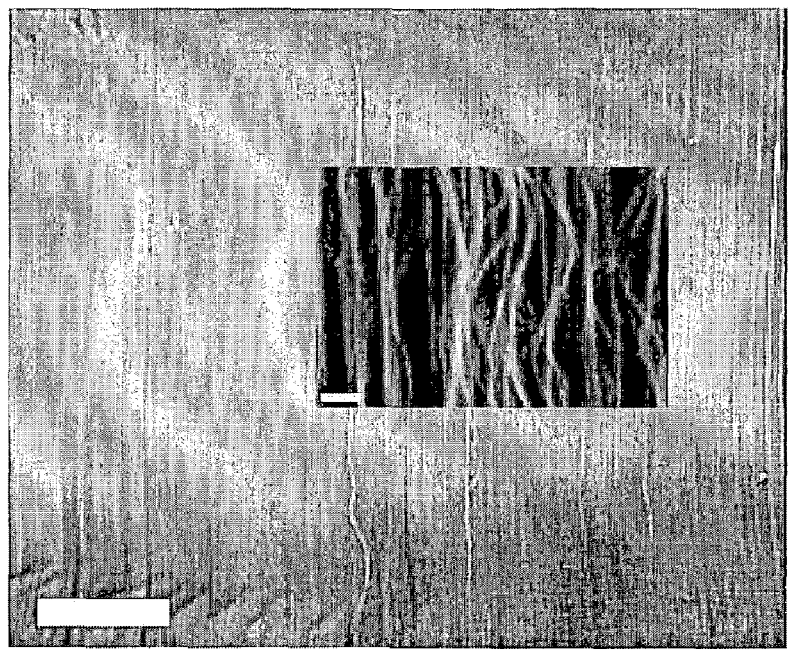
FIG. 5 shows an SEM image of a carbon nanotube array formed by using the preferred method of the present invention, in which the central insert image is an enlarged SEM image of said carbon nanotube array.
Figure 6:
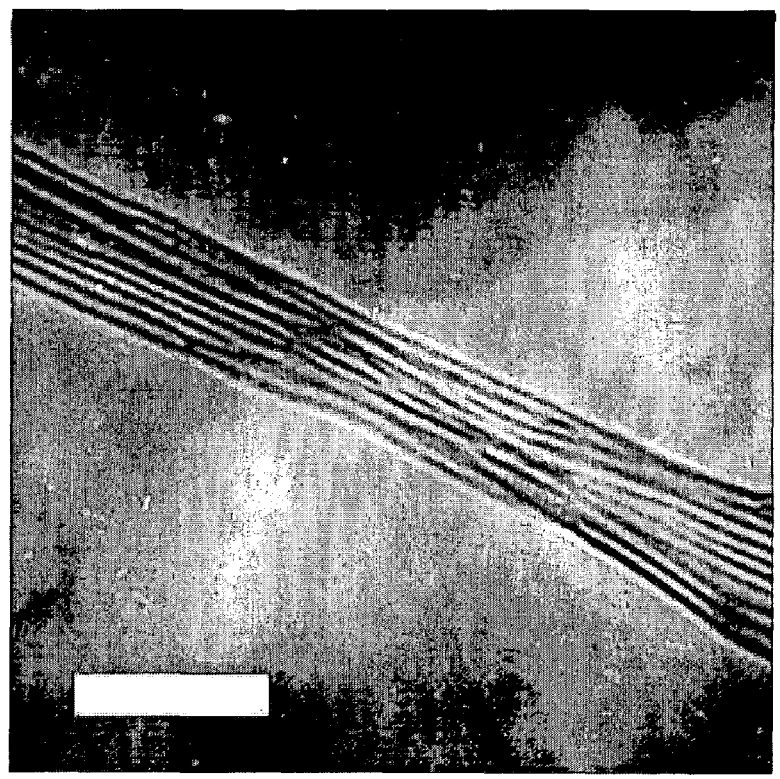
FIG. 6 shows a TEM image of a bundle of carbon nanotubes of the carbon nanotube array formed by using the preferred method of the present invention.
Figure 7:
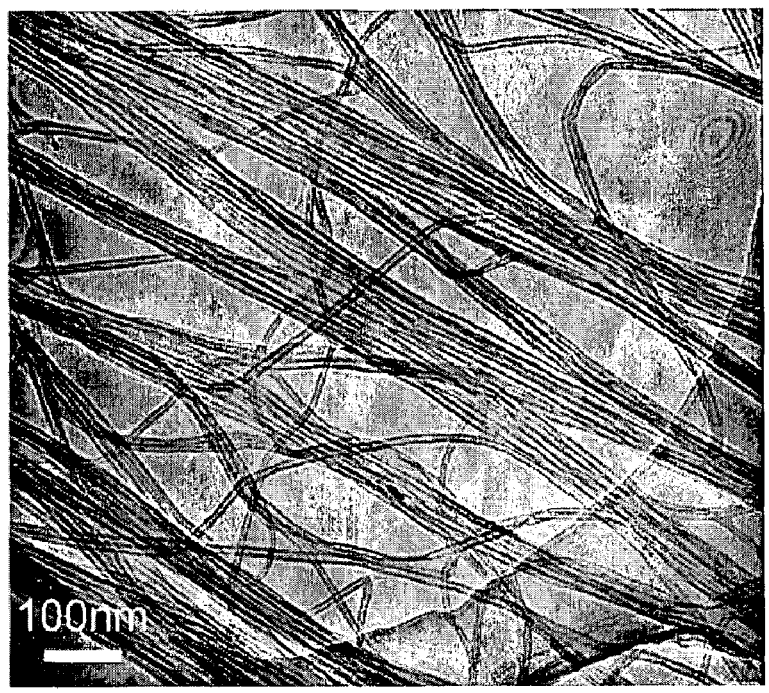
FIG. 7 shows a TEM image of a carbon nanotube array formed by using the preferred method of the present invention and then by ultrasonicating the carbon nanotubes in 1,2-dichloroethane for 10 minutes.
Figure 8:
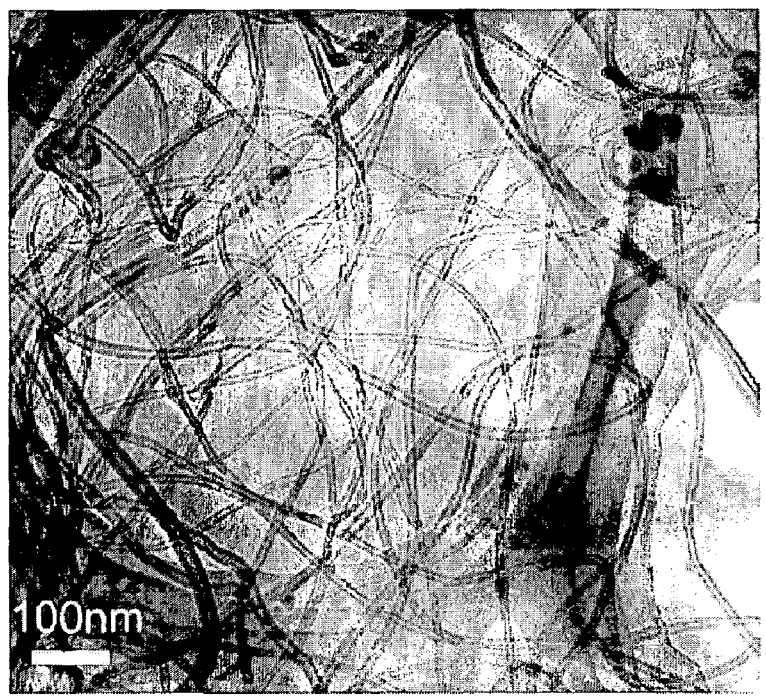
FIG. 8 shows a TEM image of a carbon nanotube array formed by using a conventional method and then by ultrasonicating the carbon nanotubes in 1,2-dichloroethane for 10 minutes.

It will be apparent to those who having skill in the field of the present invention that the growth rate of carbon nanotubes is proportional to the difference between the local temperature of the catalyst ($T_C$) and the furnace temperature ($T_L$), while the deposition rate of amorphous carbon is proportional to the partial pressure of the carbon source gas. In the method of the present invention, the difference between the temperatures of the catalyst and its surrounding environment is kept greater than 50° C. by adjusting the flow rate of carbon source gas to raise the growth rate of carbon nanotubes, while the partial pressure of carbon source gas is kept lower than 20% by adjusting the ratio of the flow rates of the carbon source gas and the protective gas to lower the deposition rate of amorphous carbon. Thus the carbon nanotubes formed by the method of the present invention have clean smooth surfaces. This provides increased van der Waals attraction between adjacent carbon nanotubes. Furthermore, because the substrate 11 has a smooth surface, the carbon nanotubes are densely formed thereon. For these reasons, the method of the present invention is highly conducive to forming a super-aligned and highly bundled carbon nanotube array 61. FIG. 5 shows an SEM image of the carbon nanotube array 61 formed by using the preferred method of the present invention, in which the central insert image is an enlarged SEM image of said carbon nanotube array 61. FIG. 6 shows a TEM image of a bundle of carbon nanotubes of the carbon nanotube array 61 formed by using the preferred method of the present invention. FIG. 7 shows a TEM image of the carbon nanotube array 61 formed by using the preferred method of the present invention, and then by ultrasonicating the carbon nanotubes in 1,2-dichloroethane for 10 minutes. As can be seen, carbon nanotubes in the carbon nanotube array 61 remain highly bundled after such treatment.

It is understood that the invention may be embodied in other forms without departing from the spirit thereof. Thus, the present examples and embodiments are to be considered in all respects as illustrative and not restrictive, and the invention is not to be limited to the details given herein.

The invention claimed is:

1. A method for forming a carbon nanotube array, comprising:
   providing a smooth substrate;
   depositing a catalyst layer on the substrate;
   placing the substrate in a furnace;
   heating the furnace to a first temperature, the first temperature being in a range from about 500° C. to about 700° C.;
   introducing a mixture of carbon source gas and a protective gas into the furnace;
   keeping a temperature of the catalyst layer at a second temperature while maintaining a partial pressure of the carbon source gas lower than 20% by actively adjusting a flow rate of the carbon source gas during growth of carbon nanotubes, whereby the second temperature is at least 50° C. higher than the first temperature and the difference between the first and second temperature is based solely upon a heat released by an exothermic reaction caused by the reaction between the carbon source gas and the catalyst; and
   growing a carbon nanotube array on the smooth substrate, the carbon nanotube array comprising of carbon nanotubes, wherein the carbon nanotubes' growth rate is increased as a result of the exothermic reaction, and the grown carbon nanotubes have clean smooth surfaces such that adjacent carbon nanotubes are bundled together by Van der Waals force therebetween.

2. The method for forming a carbon nanotube array as described in claim 1, wherein the substrate is a silicon wafer or a silicon wafer with a thermal-oxidized layer thereon.

3. The method for forming a carbon nanotube array as described in claim 1, wherein the substrate is a P-type silicon wafer with a thermal-oxidized layer thereon.

4. The method for forming a carbon nanotube array as described in claim 1, the substrate is polished to obtain a smooth surface on the substrate.

5. The method for forming a carbon nanotubes array as described in claim 1, wherein the partial pressure of the carbon source gas lower than 20% is created by adjusting a ratio of flow rates of the carbon source gas and the protective gas.

6. The method for forming a carbon nanotube array as described in claim 1, wherein the partial pressure of the carbon source gas is maintained at approximately 10%.

7. The method for forming a carbon nanotube array as described in claim 1, wherein the catalyst layer comprises material selected from the group consisting of iron, cobalt, nickel and any alloy thereof.

8. The method for forming a carbon nanotube array as described in claim 7, wherein the catalyst layer comprises iron, and has a thickness of approximately 5 nanometers.

9. The method for forming a carbon nanotube array as described in claim 1, further comprising the following step: annealing the substrate with the catalyst formed thereon in air at a temperature in the range from 300° C. to 400° C. for approximately 10 hours after depositing the catalyst layer on the substrate.

10. The method for forming a carbon nanotube array as described in claim 9, further comprising the following step: reducing the annealed substrate with the catalyst formed thereon, to form catalyst particles having nano-sized diameters.

11. The method for forming a carbon nanotube array as described in claim 10, further comprising the following step: heating the reduced substrate in flowing protective gas before introducing the mixture of acetylene gas and protective gas.

12. The method for forming a carbon nanotube array as described in claim 1, wherein the first temperature is in a range from 500° C. to 650° C.

13. The method for forming a carbon nanotube array as described in claim 1, wherein the catalyst is iron, and the first temperature is approximately 650° C.

14. The method for forming a carbon nanotube array as described in claim 1, wherein the protective gas is selected from the group consisting of nitrogen and a noble gas.

15. The method for forming a carbon nanotube array as described in claim 14, wherein the protective gas is argon.

16. The method for forming a carbon nanotube array as described in claim 1, wherein the carbon source gas is selected from the group consisting of acetylene, ethylene and any suitable chemical compound which contains carbon and releases heat caused by the reaction between the carbon source gas and the catalyst.

17. A method for forming a carbon nanotube array, comprising:

placing a catalyst layer in a furnace;

heating the furnace to a first temperature introducing a mixture of carbon source gas and a protective gas into the furnace;

starting to growing a carbon nanotube array on the catalyst layer at a first growth rate at the first temperature;

continuing to growing the carbon nanotube array on the catalyst layer at an increased second growth rate relative to the first growth rate by keeping the temperature of the catalyst layer at a second temperature and maintaining a partial pressure of the carbon source gas lower than 20% by actively adjusting a flow rate of the carbon source gas during growing of the carbon nanotube array, whereby the second temperature is at least 50° C. higher than the first temperature.

18. The method for forming a carbon nanotube array as described in claim 17, wherein the first temperature is in a range from about 500° C. to about 700° C.

19. The method for forming a carbon nanotube array as described in claim 17, wherein the catalyst layer is heated up from the first temperature to the second temperature by a heat released by an exothermic reaction caused by the reaction between the carbon source gas and the catalyst.

* * * * *